United States Patent [19]

Halligan

[11] 4,003,414

[45] Jan. 18, 1977

[54] DIP LEAD FORMER

[76] Inventor: Dewey D. Halligan, 6251 Empress Court, San Jose, Calif. 95129

[22] Filed: Feb. 20, 1976

[21] Appl. No.: 659,766

[52] U.S. Cl. .................................. 140/1; 140/139; 140/147; 72/DIG. 10
[51] Int. Cl.² ........................................ B21F 1/02
[58] Field of Search .............. 140/147, 1, 105, 139, 140/140; 72/DIG. 10

[56] References Cited

UNITED STATES PATENTS

| | | | |
|---|---|---|---|
| 2,860,686 | 11/1958 | Frank et al. ................... | 72/DIG. 10 |
| 2,878,841 | 3/1959 | Peterson et al. ............. | 72/DIG. 10 |
| 3,414,024 | 12/1968 | Anderson et al. ................ | 140/1 |
| 3,540,494 | 11/1970 | Susong ................... | 140/1 |
| 3,687,172 | 8/1972 | Suverkropp ........................ | 140/147 |
| 3,738,398 | 6/1973 | Galloway ............................. | 140/1 |
| 3,796,201 | 3/1974 | Golub .................................... | 140/1 |
| 3,822,728 | 7/1974 | Heller et al. ............................ | 140/1 |
| 3,880,205 | 4/1975 | Linker et al. ....................... | 140/147 |

*Primary Examiner*—John E. Roethel
*Attorney, Agent, or Firm*—Boone, Schatzel, Hamrick & Knudsen

[57] ABSTRACT

A DIP lead former including a cabinet housing an electric motor, a pair of lead forming rollers disposed in side-by-side spaced apart relationship and driveably coupled to the motor, an elongated forming rail located between the lead forming rollers for transporting DIPs into engagement with the rollers, an upper guide for guiding the DIPs along the forming rail, and a pair of adjustment knobs for varying the distance between the upper guide and the forming rail.

11 Claims, 7 Drawing Figures

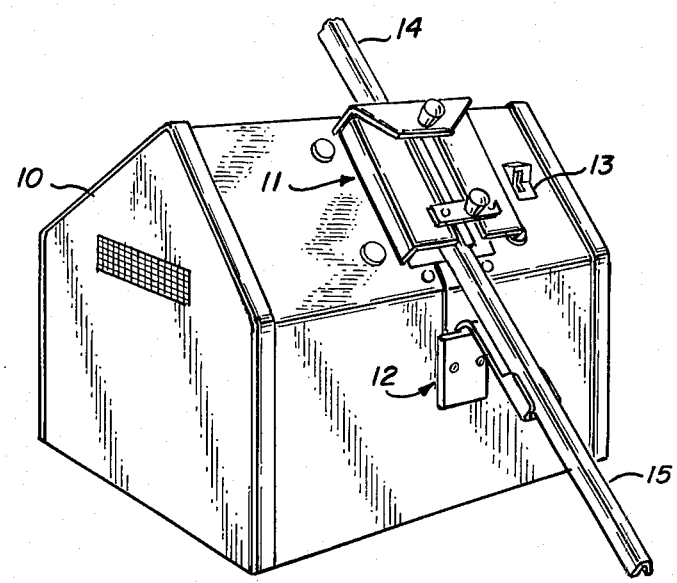
Fig_1
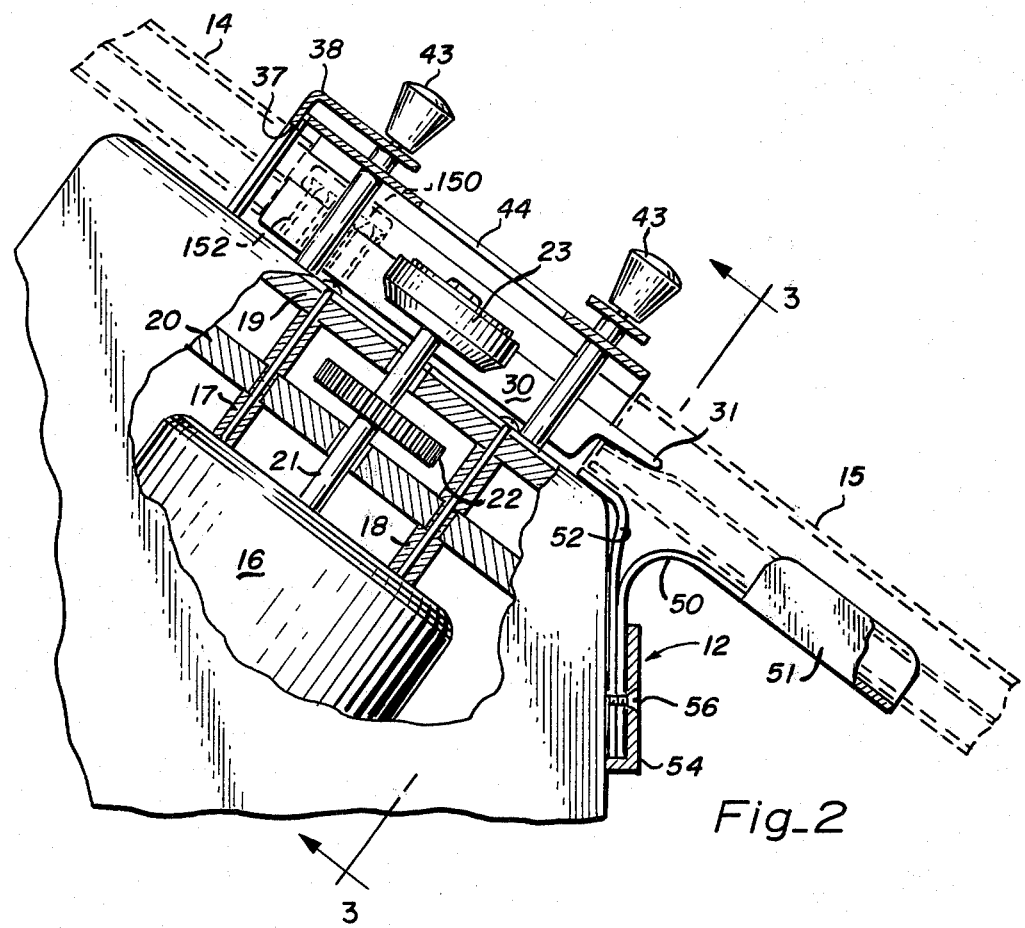
Fig_2

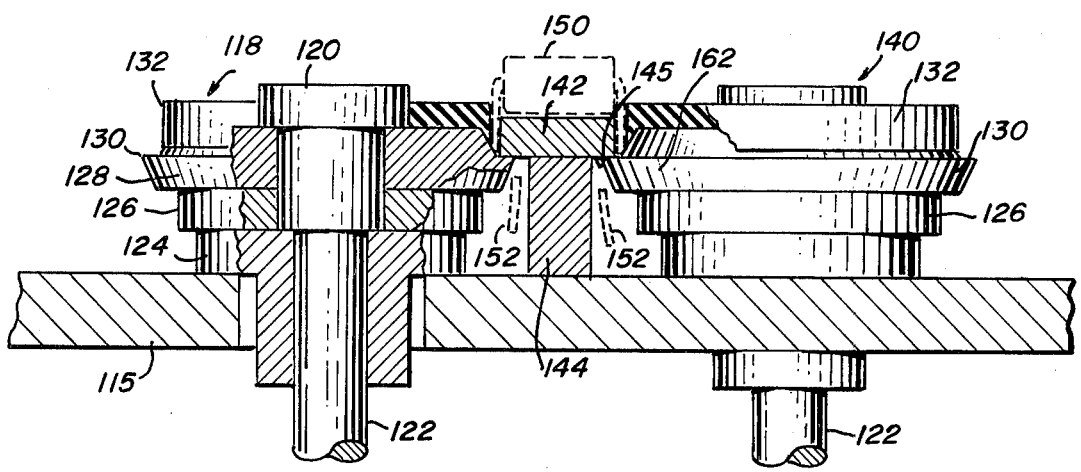
Fig_6
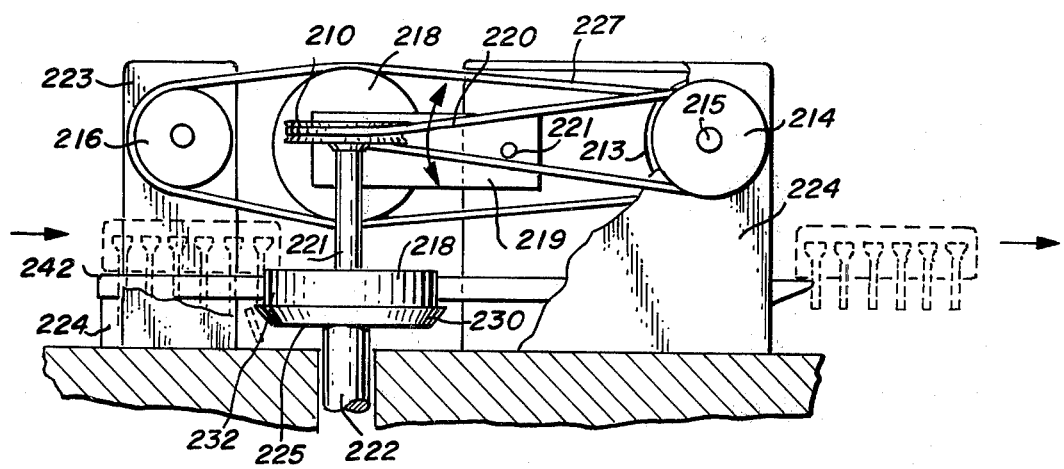
Fig_7

DIP LEAD FORMER

BACKGROUND OF THE INVENTION

1. Field of the Invention

The present invention relates generally to integrated circuit package processing equipment and more particularly to an automatic lead forming apparatus for use in straightening and/or forming the leads of Dual-Inline-Package (DIP) integrated circuit module.

2. Description of the Prior Art

DIP integrated circuit modules are used extensively in the electronics industry because of their versatility, small size, and inexpensive cost. Typically, several DIPs will be mounted either manually or by machine on a printed circuit board along with appropriate discreet components such as resistors, capacitors, power transistors, etc. Large circuit board manufacturers utilize sophisticated automatic insertion machines to mount DIPs while smaller manufacturers, who cannot afford such expensive machinery, must mount DIPs by hand.

In both cases the mounting of the DIPs on the printed circuit boards is complicated by the fact that the leads on one side of the DIP are usually not aligned exactly parallel to the leads on the other side when the DIP comes from the component manufacturer. More specifically, the leads are typically flared outwardly about fifteen degrees relative to a normal to the bottom surface of the DIP. This flare results in about a 0.070 inch misalignment between the DIP leads and the predrilled holes in the circuit board. Consequently, before the DIPs can be mounted to the boards, the leads on each side must be bent slightly so that they are parallel to each other and normal to the boards surface. If the leads are not parallel, some of the leads will align with holes in the circuit board while others will not. Those that do not align will often be bent into a position which will either cause an undesired open circuit or short. Both of these conditions require costly rework and reduce overall efficiency in circuit manufacturing.

SUMMARY OF THE PRESENT INVENTION

It is therefore a principal object of the present invention to provide an apparatus for uniformly forming or straightening and aligning DIP leads to facilitate their insertion into printed circuit boards.

Briefly, a preferred embodiment of a DIP lead former in accordance with the present invention includes a cabinet housing an electric motor, a pair of lead forming rollers disposed in side-by-side spaced apart relationship and driveably coupled to the motor, an elongated forming rail located between the lead forming rollers for transporting DIPs into engagement with the rollers, an upper guide for guiding the DIPs along the forming rail, and a pair of adjustment knobs for varying the distance between the upper guide and the forming rail.

An advantage of the present invention is that it may be used to uniformly form or straighten DIP leads at a high rate of speed.

Another advantage of the present invention is that the DIP leads are bent one at a time causing minimal stress on the DIP package.

Still another advantage of the present invention is that it will pass DIPs having small amounts of solder on their leads but it will not pass grossly deformed DIPs with factory or shipping bent leads.

Still another advantage of the present invention is that it uses resilient composition rollers that are preset and require no adjustment in order to handle different lead frame materials.

Other objects and advantages of the present invention will become apparent to those skilled in the art after having read the following detailed description of a preferred embodiment which is illustrated in the several figures of the drawing.

IN THE DRAWING

FIG. 1 is a perspective view illustrating a DIP lead former in accordance with the present invention;

FIG. 2 is a partially broken away side view illustrating the principal components of the DIP lead former shown in FIG. 1;

Fig. 6 is a partially cut-away alternative illustration showing an embodiment of the present invention which additionally includes means for trimming the DIP leads to a predetermined length; and FIG. 7 is a second alternative embodiment of the present invention which further includes means for automatically accommodating several different size DIPs.

DETAILED DESCRIPTION OF THE PREFERRED EMBODIMENT

Figure 3:
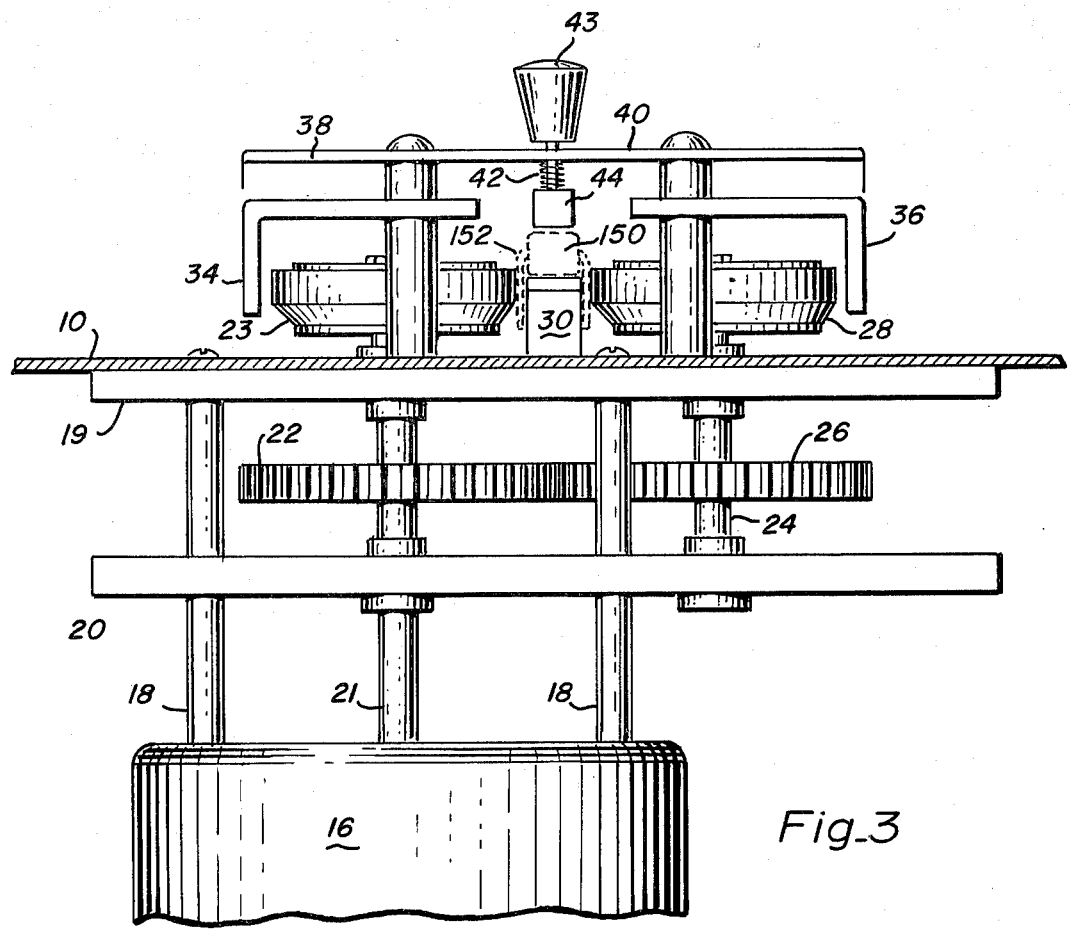
FIG. 3 is a front view of the apparatus shown in FIG. 2 taken along the line 2—2.

Referring now to the drawing, a perspective view of a preferred embodiment of the present invention is shown in FIG. 1. As illustrated the device includes a housing or cabinet 10, a shroud and guide assembly 11, a receiving tube holder assembly 12 and on/off switch 13. As will be further described below, one end of a DIP carrying feed tube or "stick" 14 is inserted into the top side of assembly 11 and a receiving tube or "stick" 15 is inserted into the lower side and is held in place by the holder assembly 12. Once a loaded feed stick and an empty receiving stick are inserted as illustrated and the switch 13 is depressed into the on position, the DIPs contained in stick 14 will be continuously fed through the forming device and into stick 15.

In FIGS. 2 and 3 of the drawing, partially broken-away side and front views of the apparatus are shown to generally illustrate the operative components of the preferred embodiment. The apparatus includes an electric motor 16 which is suspended from the upper surface of housing 10 by a pair of mounting brackets 17 and 18, which also support a pair of mounting plates 19 and 20. Motor 16 is provided with a drive shaft 21 having a gear wheel 22 affixed thereto midway along its length and a forming roller 23 affixed to its distal end. Positioned to the right side (FIG. 3) of and journaled to plates 19 and 20 is a second shaft 24 having a second gear wheel 26, affixed thereto in a position to be driveably engaged by gear wheel 22, and a second forming roller 28 affixed to its distal end. Forming rollers 23 and 28 may be made of any suitable material but in the preferred embodiment are of a composite material which provides a firm, but resilient, forming perimeter surface. Actual roller structures are discussed below with respect to FIGS. 4 and 5.

Mounted to the upper plate 19 is a forming rail 30 having flat vertical side surfaces which cooperate with the rollers 23 and 28 to form the DIP leads as illustrated in phantom in FIG. 3. One of the principal advantages of the present invention is that even though the distances between the roller surfaces and the sides of rail 30 are fixed, the resilient roller surfaces allow passage of various size leads and even leads having small globules of solder attached thereto.

The length of rail 30 is, as indicated in FIG. 2, sufficient to reach from the discharge location of the end of stick 14 to the receiving end of stick 15. Note that at the discharge end a lip 31 extends in cantilever fashion so as to project into stick 15 and insure easy passage of DIPs thereinto.

Also mounted to plate 19 are four standards 32 which support a pair of side cover plates 34 and 36, a rear cover plate 38 and a support bar 40. Suspended from rear plate 38 and bar 40 by means of threaded adjustment screws 42 (FIG. 3) is a top guide bar 44 which extends along the length of rail 30. The screws 42 are threaded into either bar 44 or the supporting plate 38 and bar 40, and have knurled knobs 43 attached to their upper ends so that they can be rotated to adjust the position of guide bar 44 relative to the top of rail 30.

It should be noted that the top surface of cabinet 10 is tilted at an angle. This allows the apparatus to employ a gravity feed system for feeding DIPs into, through and out of the forming mechanism. As shown in broken lines, the DIP carrier stick 14 is inserted through an opening 37 in the back cover plate 38 and is aligned with the forming rail 30 so that DIPs entering the forming apparatus from the carrier stick will straddle the forming rail 30 as they pass through the apparatus. The top of cabinet 10 in combination with opening 37 provide adequate support for holding the carrier stick in position.

As previously indicated, at the other end of rail 30 a second carrier stick 15 (also shown in broken lines) is placed so as to receive the DIPs after they leave the forming mechanism. This second carrier stick is supported by holder assembly 12 which includes a holding arm 50 and a leaf spring 52 that are attached to housing 10 by a simple bracket 54 and screw 56. Spring 52 holds the lower portion of the inside of the carrier stick 15 snugly against lip 31 so that DIPs leaving the apparatus will slide directly into the receiving carrier stick. The distal end of arm 50 is provided with up-turned sides 51 which grip the stick and hold it in place as illustrated. Thus, alignment is realized between the feed stick 14, forming rail 30, and receiving stick 15 allowing gravity feed through the apparatus and eliminating the need for any complicated feed through mechanism.

Returning now to FIG. 3, it will be noted that roller 23 and gear 22 are respectively identical in size and construction to roller 28 and gear 26, and that shaft 24 is located so that gear 22 will mesh with gear 26. Thus, as motor 11 rotates shaft 21, shaft 24 will likewise rotate at the same speed, but in the opposite direction. As a result, roller 28 will be driven at the same speed but in the opposite direction to roller 23.

In operation, a carrier stick 14 loaded with DIPs is placed in position, as illustrated in FIG. 1, with its lower end inserted through the opening 37 and in abutting relationship with the upper end of rail 30. The DIPs immediately begin sliding downward under their own weight and are guided along rail 30 by guide bar 44 which has previously been set to the proper height. However, since the rollers 23 and 28 are not yet rotating and their contact surfaces are so close to rail 30 so as to prevent passage of the DIP leads therebetween, the DIPs will stack up against the rollers. Motor 11 is then energized and as rollers 23 and 28 begin to rotate, they resiliently engage the DIP leads and deform them against rail 30 while at the same time urging the DIP along the rail. It is important to note that the leads on each side are progressively addressed and stressed by the rollers rather than being deformed simultaneously. Consequently, the stress on the DIP package itself is kept to a minimum. After passing between the rollers, the DIPs will continue to slide down rail 30, over lip 31, and into carrier stick 15.

Figure 4:
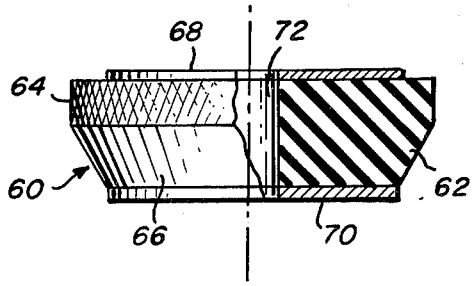
FIGS. 4 and 5 are partially broken illustrations showing alternative embodiments of the forming rollers depicted in FIGS. 2 and 3.

Turning now to FIG. 4, there is shown at 60 one embodiment of a roller suitable for use in the previously described embodiment. Roller 60 includes an annular body 62 of a composite material that is firm enough to perform the desired forming operation yet resilient enough to accommodate a range of lead materials, sizes and dimensions without requiring positional adjustment relative to the guide rail. In the preferred embodiment, body 62 is of a urethane plastic or rubber composition having a shore 85 to 98 durometer. The annular outer surface 64 is preferably knurled to aid in its engagement with leads to be formed and if desirable could be impregnated with material for making it electrically conductive. The lowermost portion 66 of roller 60 is smooth and conically tapered as indicated, so as not to engage the leads before they are engaged by the forming surface 64.

Positioned top and bottom of body 62 are flat washers 68 and 70 that are located with their apertures concentric with the shaft receiving central bore 72. It will be appreciated that since body 62 is resilient and compressible, its outer diameter can be increased slightly, for adjustment purposes, by tightening washer 68 down relative to washer 70.

Figure 5:
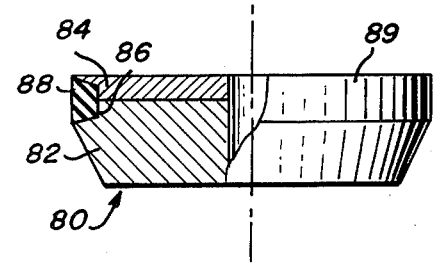

In FIG. 5 an alternative roller embodiment is shown at 80 having a body which is comprised of a frustoconical lower body member 82 and a flat upper body member 84. Circumscribing the junction of the two members is a circular groove 86 into which an annular ring 88 of composite material is placed to provide a resilient lead forming surface 89. The surface 89 may be either smooth, knurled, grooved, or otherwise surface treated to fit the particular application. Note that the upper and lower surfaces forming groove 86 converge inwardly so that when member 82 and member 84 are clamped together, ring 88 is placed in compression.

FIG. 6 illustrates an alternative embodiment of the lead forming rollers. In this case the rollers and rail have been modified to include means for also trimming the DIP leads to a desired length as they are deformed. As illustrated, this embodiment includes a pair of deforming and trimming assemblies 118 and 140 which are made up of several different parts. Included in each assembly is a hub portion 120, a shaft 122, a bearing 124 which journals the shaft to the support plate 115, a spacer 126, a chamferred shear wheel 128 having a protruding cutting edge 130, and a resilient deforming roller 132. Wheel 128 is attached to hub 120 which is in turn attached to shaft 122.

Also illustrated in FIG. 6 is a modified rail 142 which differs from the previously described rail in that it has a narrowed lower portion 144. The transition between the upper portion and the lower portion is sharp and forms a pair of shearing edges 145 for mating with the shearing wheels 128. Rail 142 is located on base 115 between roller assemblies 118 and 140 so that the rollers 132 pass near each side of rail 142 and so that the protruding edges 130 of the shear wheels pass below and inside of edges 145 and very close thereto.

As a DIP 150 proceeds down rail 142, its leads 152 are engaged by both roller 132 and shear wheel 128 and are forced toward rail 142. As the leads bottom out against the sides of rail 142, edges 130 continue to pass through the leads, shearing them off against the edges 145. The trimmed lead scrap falls upon base 115, slides downward into an appropriate receptacle (not shown), and is later disposed of.

FIG. 7 partially illustrates a second alternative embodiment of the present invention which utilizes a belt-and-pulley configuration as a top guide to hold different size DIPs in proper alignment against the forming rail. This embodiment includes a drive pulley 210 mounted to an extension of shaft 211, a pair of pulleys 213 and 214 mounted to a common shaft 215, a fixed idler pulley 216, and a movable idler pulley 218 carried by an arm 219 that is pivotally attached to a support 224 at 221. A narrow drive belt 220 is trained around pulleys 210 and 214, while a relatively wide belt 227 (e.g., about the width of the top of guide 242) is trained over pulleys 213, 216 and 218. Pulley 218 is normally biased downwardly by either a spring or through the use of an elastic belt 227.

Also shown is a forming rail 242 having a narrowed portion 244, a roller/shear wheel 225 having a protruding shearing edge 230, a shaft 222, and a resilient roller surface 232. The assembly 225 is the same as the assembly 118 which was described with regard to FIG. 4 except for the additional shaft extension 221.

The diameters of pulleys 210, 213, 214 and 216, and roller 232 are all selected so that as shaft 222 rotates, belt 227 moves a distance substantially equal to the circumferential motion of roller 232. This relationship allows belt 227, which is disposed directly above rail 242, to engage the top of and move the DIPs along rail 242 at substantially the same speed that wheel 225 is moving.

Since pulley 218 is free to move upward or downward, this embodiment eliminates the necessity of making adjustments to the upper guide, as was required in the previous embodiments. Thus, various sizes of assorted DIPs may be rapidly processed through this embodiment without the necessity of sorting them into similar sizes before processing and without the necessity of making numerous adjustments.

Although three embodiments have been set forth by way of example, it is anticipated that numerous alterations and modifications will become apparent to those skilled in the art after having read the above disclosure. For example, the forming walls of the forming rail would be other than flat, i.e., rounded, stepped, etc., so that the leads were formed into some particular non-straight configuration. In such case, it would be desirable to matingly configure the circumference of the rollers. It is therefore intended that the following claims be interpreted to cover all such alterations and modifications as fall within the true spirit and scope of the invention.

What is claimed is:

1. Apparatus for forming the leads of Dual-Inline-Packaged (DIP) electronics devices comprising:
    a cabinet;
    a motor contained within said cabinet;
    an elongated rail means affixed to said cabinet and providing a track over which DIP devices may slide, said rail means having side walls which serve as a form against which the leads of said DIP devices may be deformed;
    a pair of resilient forming rollers disposed one on each side of said rail means for engaging the leads of DIP devices sliding along said rail means and pressing the leads against said side walls;
    means driveably connecting said motor to said rollers; and
    guide means disposed above said rail means and spaced therefrom sufficient to permit a DIP device to pass therebetween.

2. Apparatus as recited in claim 1 wherein said rollers are comprised of a circular body of resilient material having a first portion having a generally cylindrical circumferential surface, and a second portion having a generally conical circumferential surface.

3. Apparatus as recited in claim 1 wherein said rollers are comprised of a rigid circular body having an annular groove formed in its outer circumference, and an annular ring of resilient material disposed in said groove, the outer circumference of said ring forming a lead engaging surface.

4. Apparatus as recited in claim 3 wherein said circular body is comprised of a generally disk-shaped upper member and a mating generally frusto-conically shaped lower member, the adjacent circumferential surfaces of said members being configured to jointly form said annular groove.

5. Apparatus as recited in claim 1 and further comprising means for adjusting the distance between said forming means and said guide means.

6. Apparatus as recited in claim 1 wherein said forming means includes a rail having a first end and a second end, said rail being of a generally rectangular cross section.

7. Apparatus as recited in claim 6 and further comprising a first holding means disposed proximate said second end of said rail for holding a receptacle appropriate for receiving the processed objects.

8. Apparatus as recited in claim 7 and further comprising a second holding means disposed proximate said first end of said rail for holding a container appropriate for containing objects to be processed.

9. Apparatus as recited in claim 8 wherein said first end of said rail is located above said second end to allow objects to be processed to slide downwardly along said rail by gravitational force.

10. Apparatus as recited in claim 1 wherein said rollers include
    a first circular portion having a chamferred circumference forming a shearing edge; and
    a second circular portion having a resilient circumferential edge; and wherein said rail means includes
    a first rail portion having a generally rectangular cross section, said first rail portion being disposed between the first circular portions of said rollers;
    a second rail portion affixed to said first rail portion and having a smaller width than said first rail portion, the transition between said first and second rail portions forming shoulders disposed to cooperate with said shearing edges to shear off portions of the leads of DIPs passed through said apparatus.

11. Apparatus as recited in claim 1 wherein said guide means includes a first pulley driveably connected to one of said rollers;
a second pulley and a third pulley connected to each other and rotatably attached to said cabinet proximate one end of said rail means;
a fourth pulley pivotally attached to said cabinet so as to be movable toward and away from said rail means;
a first belt driveably coupling said first pulley and said second pulley; and
a second belt trained across said third pulley and said fourth pulley to form a loop having a segment aligned with and disposed above said rail means.

* * * * *